United States Patent
Oh et al.

(10) Patent No.: US 9,806,113 B2
(45) Date of Patent: Oct. 31, 2017

(54) CMOS IMAGE SENSORS INCLUDING VERTICAL TRANSISTOR

(71) Applicant: Samsung Electronics Co., Ltd., Suwon-si, Gyeonggi-do (KR)

(72) Inventors: Young-Sun Oh, Yongin-si (KR); Kyung-Ho Lee, Suwon-si (KR); Jung-Chak Ahn, Yongin-si (KR); Hee-Geun Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 15/477,148

(22) Filed: Apr. 3, 2017

(65) Prior Publication Data

US 2017/0207264 A1 Jul. 20, 2017

Related U.S. Application Data

(63) Continuation of application No. 14/340,719, filed on Jul. 25, 2014, now Pat. No. 9,647,016.

(30) Foreign Application Priority Data

Feb. 21, 2014 (KR) ........................ 10-2014-0020672

(51) Int. Cl.
- *H01L 27/14* (2006.01)
- *H01L 27/146* (2006.01)
- *H01L 31/02* (2006.01)

(52) U.S. Cl.
CPC .... *H01L 27/14614* (2013.01); *H01L 27/1463* (2013.01); *H01L 27/1464* (2013.01); *H01L 27/14603* (2013.01); *H01L 27/14616* (2013.01); *H01L 27/14638* (2013.01); *H01L 27/14689* (2013.01); *H01L 31/02016* (2013.01)

(58) Field of Classification Search
CPC .......... H01L 27/1461; H01L 27/14612; H01L 27/14614; H01L 27/14616
USPC ...................................................... 257/292
See application file for complete search history.

(56) References Cited

U.S. PATENT DOCUMENTS

| | | | |
|---|---|---|---|
| 7,402,450 B2 * | 7/2008 | Ezaki | H01L 27/14603 257/E27.13 |
| 7,405,437 B2 | 7/2008 | Shim et al. | |
| 7,626,685 B2 | 12/2009 | Jin et al. | |
| 9,502,459 B2 * | 11/2016 | Miyanami | H01L 27/14643 |
| 9,647,016 B2 * | 5/2017 | Oh | H01L 27/14603 |
| 2009/0303371 A1 | 12/2009 | Watanabe et al. | |

(Continued)

FOREIGN PATENT DOCUMENTS

| | | |
|---|---|---|
| JP | 2011-049524 | 3/2011 |
| KR | 10-1999-0081249 A | 11/1999 |
| KR | 10-0672669 | 1/2007 |

*Primary Examiner* — Mark Prenty
(74) *Attorney, Agent, or Firm* — Ward and Smith, P.A.

(57) ABSTRACT

Provided is a complementary metal-oxide-semiconductor (CMOS) image sensor. The CMOS image sensor can include a substrate having a first device isolation layer defining and dividing a first active region and a second active region, a photodiode disposed in the substrate and can be configured to vertically overlap the first device isolation layer, a transfer gate electrode can be disposed in the first active region and can be configured to vertically overlap the photodiode, and a floating diffusion region can be in the first active region. The transfer gate electrode can be buried in the substrate.

5 Claims, 17 Drawing Sheets

(56) References Cited

U.S. PATENT DOCUMENTS

2011/0018037 A1 1/2011 Ohri et al.
2012/0199882 A1* 8/2012 Shin .................. H01L 27/14607
 257/222

* cited by examiner

US 9,806,113 B2

CMOS IMAGE SENSORS INCLUDING VERTICAL TRANSISTOR

CROSS-REFERENCE TO RELATED APPLICATION

This application is a continuation of U.S. patent application Ser. No. 14/340,719, filed on Jul. 25, 2014, which claims priority under 35 U.S.C. §119 to Korean Patent Application No. 10-2014-0020672 filed on Feb. 21, 2014, the disclosures of which are hereby incorporated herein by reference in their entireties.

FIELD

Embodiments of the inventive concept provide a complementary metal-oxide-semiconductor (CMOS) image sensor having a vertical transistor and a method of fabricating the same.

BACKGROUND

With the development of information and communications technology (ICT) and digitization of electronic devices, image sensors having improved performance have been used in, for example, digital cameras, camcorders, portable phones, personal communication systems (PCSs), game machines, security cameras, and medical micro cameras.

An image sensor may include a photodiode configured to convert an optical image into an electric signal and transistors (e.g., a transfer transistor, a reset transistor, and a sensing transistor) configured to transmit signals sensed by the photodiode to a signal processing circuit. With an increase in the integration density of semiconductor devices, image sensors have been gradually highly integrated. Thus, each of pixels has been downscaled, thereby increasing the likelihood of image lag.

SUMMARY

In accordance with an aspect of the inventive concept, a CMOS image sensor includes: a substrate having a first device isolation layer defining and dividing a first active region and a second active region, a photodiode disposed in the substrate and configured to vertically overlap the first device isolation layer, a transfer gate electrode disposed in the first active region and configured to vertically overlap the photodiode, and a floating diffusion region formed in the first active region. The transfer gate electrode extends into the substrate.

In accordance with another aspect of the inventive concept, a CMOS image sensor includes: a photodiode disposed in a substrate to be spaced apart from the surface of the substrate, and a device isolation layer, a transfer gate electrode, and a floating diffusion region disposed in the substrate adjacent to the surface of the substrate to vertically overlap the photodiode. The transfer gate electrode includes a buried portion configured to extend from the surface of the substrate into the substrate, and the transfer gate electrode does not extend onto the floating diffusion region.

In accordance with still another aspect of the inventive concept, a method of fabricating a CMOS image sensor includes: forming a photodiode in a substrate, forming a device isolation layer in the substrate to define an active region, forming a gate trench in the substrate, forming a gate insulating layer and a gate conductive layer in the gate trench, and patterning the gate insulating layer and the gate conductive layer to form a transfer gate insulating layer and a transfer gate electrode. The transfer gate electrode includes a buried portion buried in the substrate and a protruding portion protruding from a surface of the substrate. At least one side surface of the protruding portion is laterally recessed such that the buried portion includes an edge portion having a planar top surface.

Specific particulars of other embodiments are included in detailed descriptions and drawings.

BRIEF DESCRIPTION OF THE DRAWINGS

The foregoing and other features and advantages of the inventive concepts will be apparent from the more particular description of preferred embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings.

DETAILED DESCRIPTION OF THE EMBODIMENTS

Figure 1:
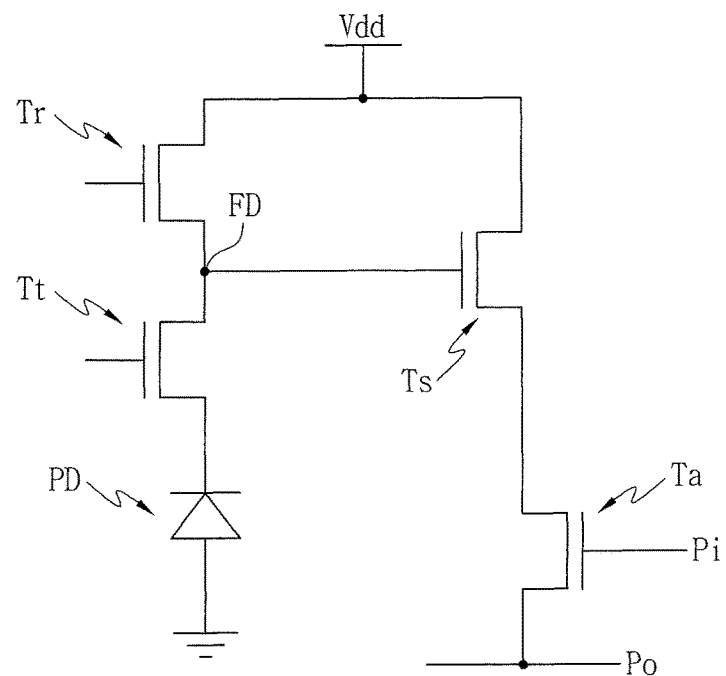
FIG. 1 is an equivalent circuit diagram of a unit pixel included in a complementary metal-oxide-semiconductor (CMOS) image sensor according to embodiments of the inventive concept.

The inventive concept is described hereinafter with reference to the accompanying drawings, in which embodiments of the inventive concept are shown. This inventive concept may, however, be embodied in different forms and should not be construed as limited to the embodiments set forth herein. Rather, these embodiments are provided so that this disclosure is thorough and complete and fully conveys the scope of the inventive concept to one skilled in the art.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof. It will be understood that when a film (or layer) is referred to as being "on" another film (or layer) or substrate, it can be directly on the other film (or layer) or substrate or intervening films (or layers) may also be present. In the drawings, the sizes or thicknesses of layers and regions are exaggerated for clarity. It will be understood that, although the terms first, second, etc. may be used herein to describe various elements, components, regions, films (or layers) and/or sections, these elements, components, regions, films (or layers) and/or sections should not be limited by these terms. Thus, a first element, component, region, film (layer) or section discussed below could be termed a second element, component, region, film (layer) or section without departing from the teachings of the inventive concept. Each of embodiments described herein includes a complementary embodiment thereto. As used herein, the term "and/or" includes any and all combinations of one or more of the associated listed items.

Like numbers refer to like elements throughout. Thus, the same or similar numbers may be described with reference to other drawings even if they are neither mentioned nor described in the corresponding drawing. Also, even elements that are not denoted by reference numbers may be described with reference to other drawings.

FIG. 1 is an equivalent circuit diagram of a unit pixel of a complementary metal-oxide-semiconductor (CMOS) image sensor according to embodiments of the inventive concept.

Referring to FIG. 1, the unit pixel of the CMOS image sensor according to the embodiments of the inventive concept may include a photodiode PD, a transfer transistor Tt, a reset transistor Tr, a sensing transistor Ts, and an access transistor Ta.

One terminal of the photodiode PD may be connected to a source of the transfer transistor Tt, and the other terminal of the photodiode PD may be grounded.

A drain of the transfer transistor Tt may be connected to a floating diffusion region FD.

A source of the reset transistor Tr may be connected to the floating diffusion region FD, and a drain of the reset transistor Tr may be connected to a power supply voltage Vdd.

A gate of the sensing transistor Ts may be connected to the floating diffusion region FD, and a drain of the sensing transistor Ts may be connected to the power supply voltage Vdd. A source of the sensing transistor Ts may be connected to a drain of the access transistor Ta.

A source of the access transistor Ta may be connected to an output port Po, and a gate of the access transistor Ta may be connected to an input port Pi.

Charges generated by the photodiode PD may be transferred to the floating diffusion region FD by the transfer transistor Tt and accumulated. The charges accumulated in the floating diffusion region FD may be applied to the gate of the sensing transistor Ts and turn on the sensing transistor Ts. The sensing transistor Ts may supply a power supply voltage Vdd to the access transistor Ta according to the quantity of the charges. When a turn-on voltage is applied from the input port Pi to the gate of the access transistor Ta, the access transistor Ta may be turned on so that an electric signal corresponding to the quantity of the charges applied to the gate of the sensing transistor Ts may be output to the output port Po. Thereafter, when the reset transistor Tr is turned on, the floating diffusion region FD may be charged with a power supply voltage Vdd. The same voltage as the power supply voltage Vdd may be applied to the input port Pi, the gate of the transfer transistor Tt, and the gate of the reset transistor Tr.

As appreciated by the present inventors, in some transfer transistors having a typical T-shaped transfer gate, the T-shaped transfer gate can extend onto a floating diffusion region and vertically overlap the floating diffusion region. A voltage of the floating diffusion region can rises due to the T-shaped transfer gate in a region in which the T-shaped transfer gate overlaps the floating diffusion region, thereby causing white spot defects. Also, in the overlap region, humps occur due to a non-uniform variation in potential.

Figure 2:
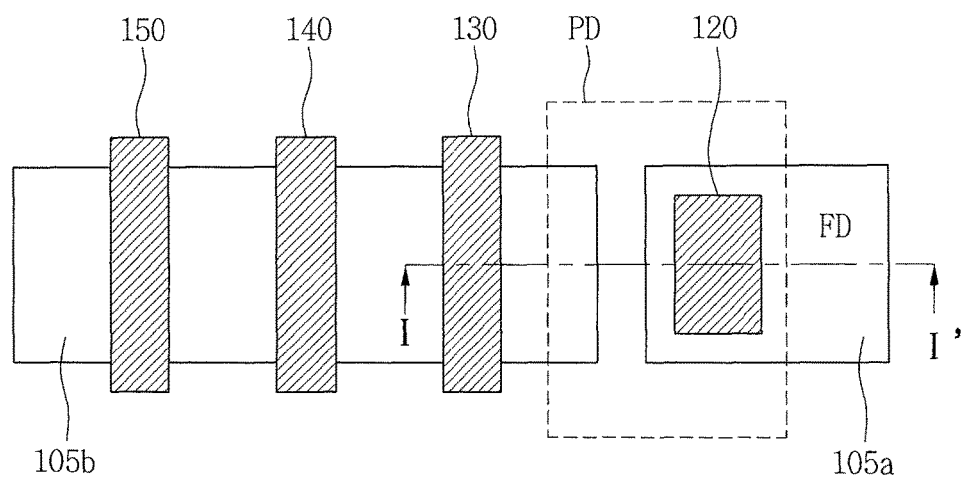
FIG. 2 is a schematic layout of a unit pixel included in a CMOS image sensor according to embodiments of the inventive concept.

FIG. 2 is a schematic layout of a unit pixel included in a CMOS image sensor according to some embodiments of the inventive concept.

Referring to FIG. 2, the CMOS image sensor according to the embodiments of the inventive concept may include a first active region 105a and a second active region 105b. The CMOS image sensor may include a transfer gate electrode 120 and a floating diffusion region FD disposed in the first active region 105a. The CMOS image sensor may include a reset gate electrode 130, a sensing gate electrode 140, and an access gate electrode 150 disposed in the second active region 105b. The CMOS image sensor may include a photodiode PD, which may overlap the first active region 105a and the second active region 105b.

Figure 3A:
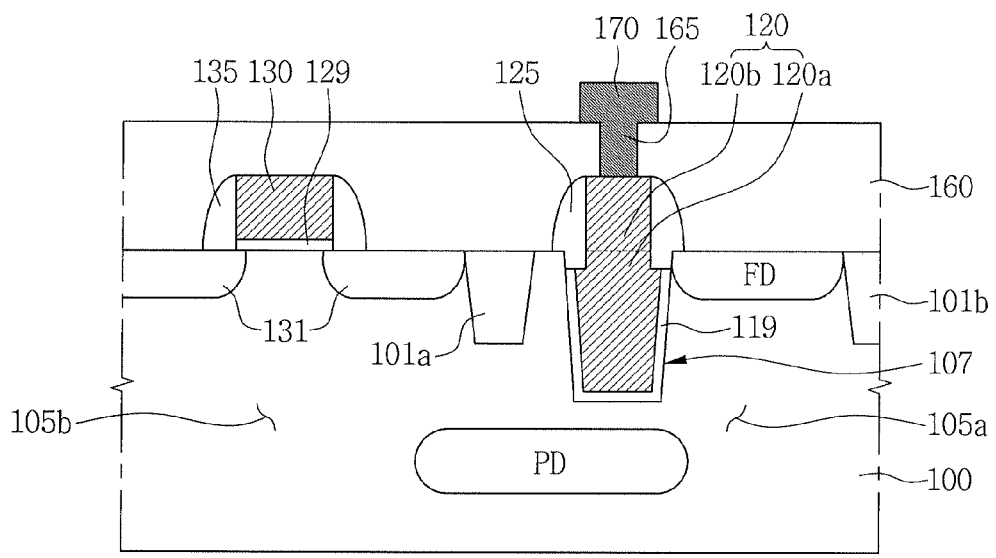
FIGS. 3A through 3C are longitudinal sectional views taken along line I-I' of FIG. 2, illustrating CMOS image sensors according to embodiments of the inventive concept.
Figure 3B:
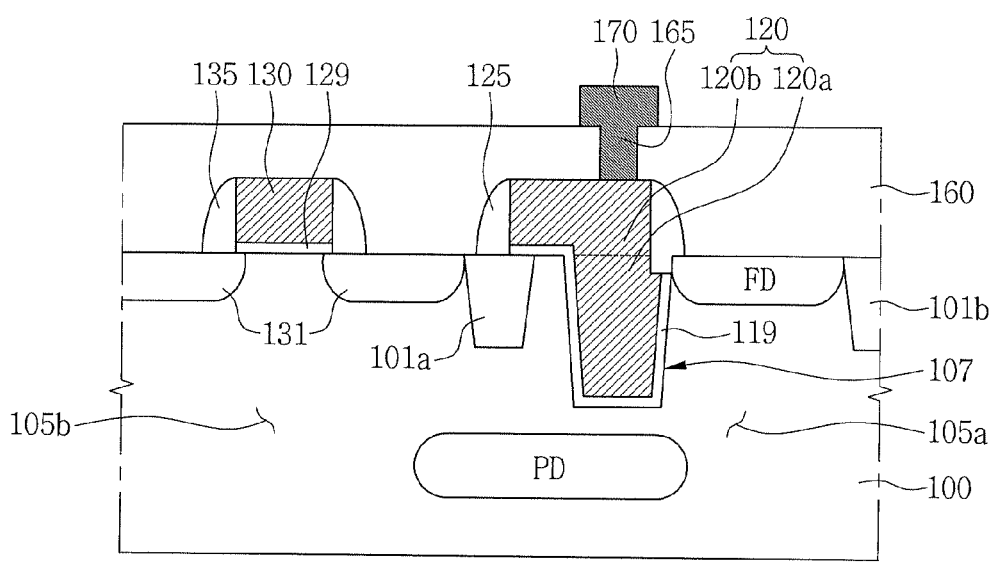
Figure 3C:
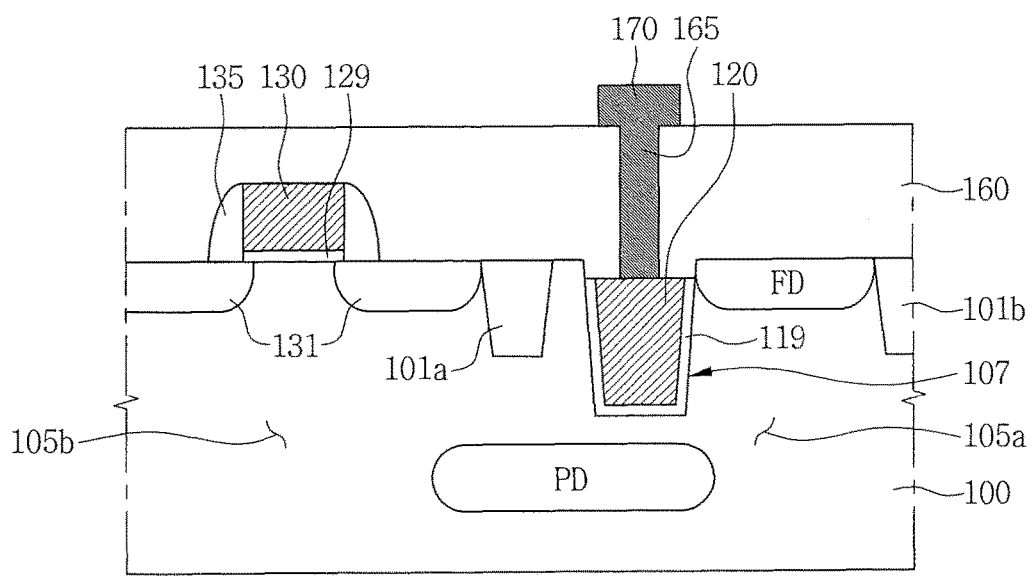

FIGS. 3A through 3C are longitudinal sectional views taken along line I-I' of FIG. 2, illustrating CMOS image sensors according to some embodiments of the inventive concept.

Referring to FIGS. 3A through 3C, each of CMOS image sensors 10a, 10b, and 10c according to embodiments of the inventive concept may include a first active region 105a and a second active region 105b, which may be disposed in a substrate 100 and divided and defined by device isolation layers 101a and 101b. For example, a first device isolation layer 101a may define and divide the first active region 105a from the second active region 105b. A second device isolation layer 101b may surround and abut the first active region 105a.

Each of the CMOS image sensors 10a, 10b, and 10c may include a transfer gate electrode 120 and a floating diffusion region FD disposed in the first active region 105a. Each of the CMOS image sensors 10a, 10b, and 10c may include a reset gate electrode 130 disposed on the second active region 105b. Each of the CMOS image sensors 10a, 10b, and 10c may include a photodiode PD disposed in a deep region of the substrate 100. The photodiode PD may be doped with N-type impurities and form a PN junction with the substrate 100.

The substrate 100 may include any one of a single-crystalline silicon wafer, a silicon-on-insulator (SOT) wafer, or a semiconductor epitaxial layer.

Each of the device isolation layers 101a and 101b may be a shallow trench isolation (STI) layer. Accordingly, each of the device isolation layers 101a and 101b may include an isolation trench and a device isolation insulating material filling the isolation trench. The device isolation insulating material may include silicon oxide.

The floating diffusion region FD may be formed between the transfer gate electrode 120 and the second device isolation layer 101b. The floating diffusion region FD may abut a surface of the substrate 100. One side surface of the floating diffusion region FD may be adjacent to one side surface of the transfer gate electrode 120, and the other side surface thereof may abut the second device isolation layer 101b.

The floating diffusion region FD may partially vertically overlap the photodiode PD. The floating diffusion region FD may contain N-type dopants. The transfer gate electrode 120, the photodiode PD, and the floating diffusion region FD may constitute the transfer transistor Tt. The photodiode PD may correspond to a source of the transfer transistor Tt, and the floating diffusion region FD may correspond to a drain of the transfer transistor Tt.

Referring to FIGS. 3A and 3B, the transfer gate 120 may include a buried portion 120a buried in the substrate 100 and a protruding portion 120b protruding from the surface of the substrate 100. The buried portion 120a may fill a gate trench 107. Within the gate trench 107, a transfer gate insulating layer 119 may be interposed between the buried portion 120a and the substrate 101. A vertical channel may be formed in the substrate 100 between the photodiode PD and the floating diffusion region FD along sidewalls and bottom of the gate trench 107. Side surfaces of the protruding portion 120b may be trimmed or recessed in a lateral direction. Upper corner (or edge) portions of the buried portion 120a may be disposed at a level lower than the surface of the substrate 100. Upper end portions of the transfer gate insulating layer 119 may be disposed at a level lower than the surface of the substrate 100. Transfer gate spacers 125 may be formed on both sidewalls of the protruding portion 120b of the transfer gate electrode 120. Lower end portions of the transfer gate spacers 125 may be disposed at a level lower than the surface of the substrate 100 to partially fill the inside of the transfer gate trench 107. The transfer gate spacers 125 may include an insulating material, such as silicon oxide or silicon nitride.

Referring to FIG. 3A, both sidewalls of the protruding portion 120b of the transfer gate electrode 120 may be trimmed such that a maximum horizontal width of the protruding portion 120b is smaller than a maximum horizontal width of the buried portion 120a.

Referring to FIG. 3B, a portion of the protruding portion 120b may horizontally extend onto the surface of the substrate 100 and a portion of the first device isolation layer 101a. The maximum horizontal width of the protruding portion 120b may be greater than the maximum horizontal width of the buried portion 120a.

Referring to FIG. 3C, the transfer gate electrode 120 may be completely buried within the gate trench 107. A top surface of the transfer gate electrode 120 may be disposed at a lower level than the surface of the substrate 100. In the present embodiments, the transfer gate spacers 125 shown in FIGS. 3A and 3B may be omitted.

Referring back to FIGS. 3A through 3C, the reset gate electrode 130 may be disposed as a planar transistor type on the substrate 100. A reset gate insulating layer 129 may be interposed between the reset gate electrode 130 and the second active region 105b of the substrate 100. The reset gate insulating layer 129 may include the same material as the transfer gate insulating layer 119. Reset gate spacers 135 may be disposed on sidewalls of the reset gate electrode 130. The reset gate spacers 135 may include the same material as the transfer gate spacers 125. Source and drain regions 131 may be disposed in the substrate 100 adjacent to sidewalls of the reset gate electrode 130. One of the source and drain regions 131 may partially overlap the photodiode PD. The one of the source and drain regions 131 may abut the first device isolation layer 101a, which may overlap the photodiode PD.

A lowermost end portion of the transfer gate electrode 120 may be disposed at a level lower than lowermost end portions of the device isolation layers 101a and 101b. For example, a distance between the transfer gate electrode 120 and the photodiode PD may be smaller than a distance between the first device isolation layer 101a and the photodiode PD.

An interlayer insulating layer 160 may be formed on the substrate 100 to cover the transfer gate electrode 120 and the reset gate electrode 130. The interlayer insulating layer 160 may include silicon oxide.

A conductive via plug 165 and a metal interconnection 170 may vertically penetrate the interlayer insulating layer 160 and be connected to the transfer gate electrode 120.

In the CMOS image sensors according to various embodiments of the inventive concept, the transfer gate electrode 120 may not extend onto the floating diffusion region FD so that the transfer gate electrode 120 cannot vertically overlap the floating diffusion region FD. Accordingly, since a non-uniform electric field is prevented from occurring between the transfer gate electrode 120 and the floating diffusion region FD, image lag may be reduced.

FIGS. 4A through 4H are cross-sectional views taken along line I-I' of FIG. 2, illustrating methods of fabricating CMOS image sensors according to embodiments of the inventive concept.

Figure 4A:
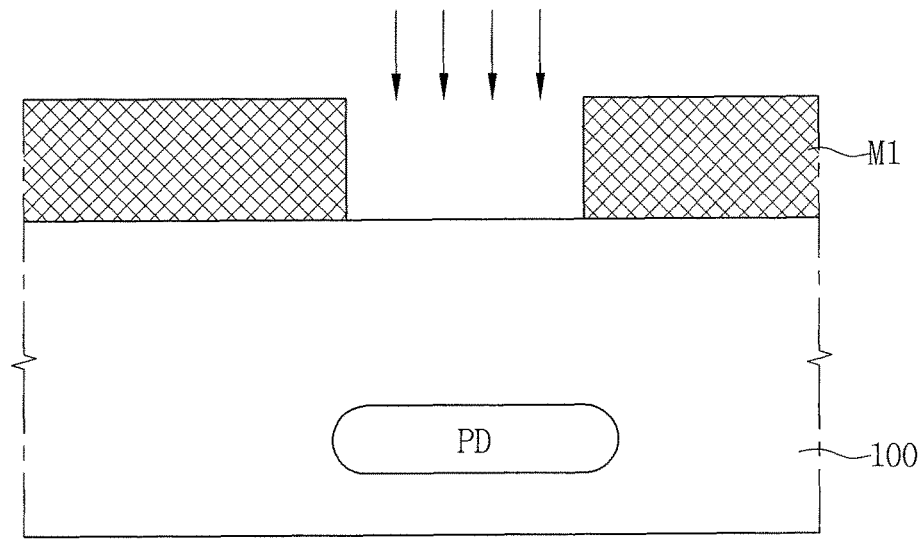
FIGS. 4A through 6D are cross-sectional views taken along line I-I' of FIG. 2, illustrating methods of fabricating CMOS image sensors according to embodiments of the inventive concept.

Referring to FIG. 4A, methods of fabricating CMOS image sensors according to embodiments of the inventive concept may include preparing a substrate 100 and performing an ion implantation process to form a photodiode PD buried in the substrate 100. The ion implantation process may include forming a first ion implantation mask M1 on the substrate 100 and performing a high-energy ion implantation process using the first ion implantation mask M1 to implant an N-type dopant into a deep region of the substrate 100. The substrate 100 may be any one of a silicon wafer, an SOI substrate, or a semiconductor epitaxial growth layer. The first ion implantation mask M1 may include photoresist or hardmask such as silicon nitride or silicon oxide. Thereafter, the first ion implantation mask M1 may be removed.

Figure 4B:
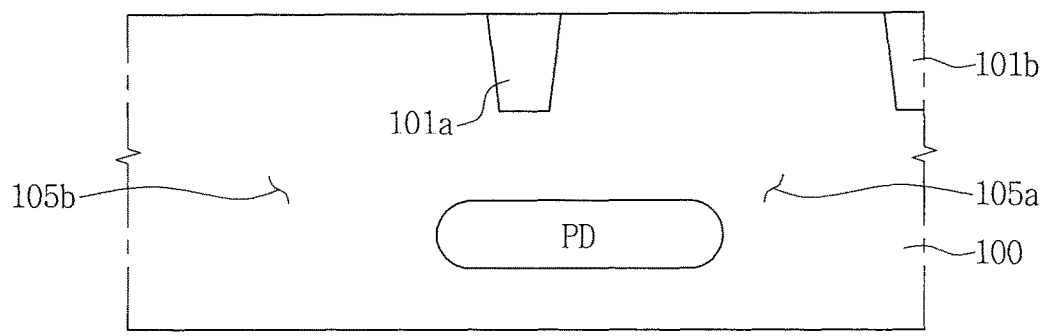

Referring to FIG. 4B, the method may include performing an STI process to form a first device isolation layer 101a and a second device isolation layer 101b in the substrate 100. The STI process may include forming isolation trenches in the substrate 100 and filling the insides of the isolation trenches with an insulating material, such as silicon oxide. The first device isolation layer 101a may vertically overlap the photodiode PD. The first device isolation layer 101a and the second device isolation layer 101b may be unified to be materially or geometrically in continuity with each other in a layout or a top view.

Figure 4C:
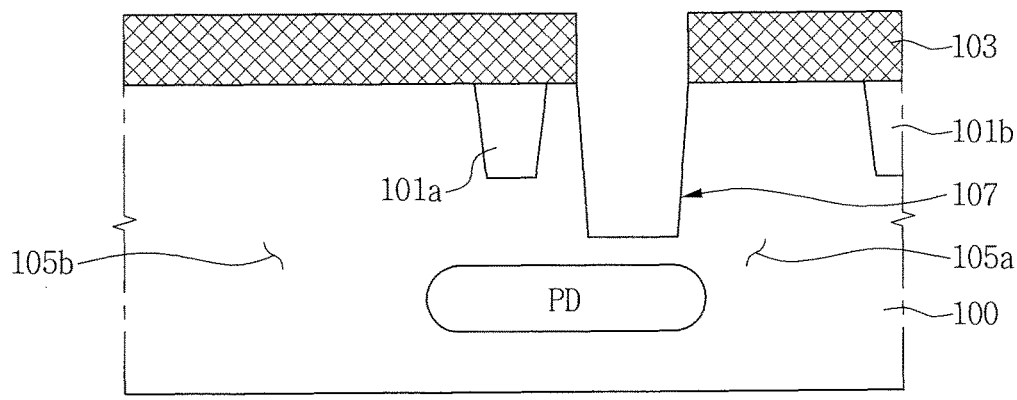

Referring to FIG. 4C, the method may include performing a trench etching process to form a gate trench 107. The trench etching process may include forming a trench mask 103 on the substrate 100 and etching the substrate 100 using the trench mask 103 as an etch mask. The trench mask 103 may include photoresist or hardmask such as silicon nitride or silicon oxide. The trench etching process may include performing a dry plasma etching process using a high-power radio frequency (RF). The gate trench 107 may be formed to have a greater depth than the device isolation layers 101a and 101b. The gate trench 107 may vertically overlap the photodiode PD. A bottom surface of the gate trench 107 may be spaced apart from the photodiode PD. Subsequently, the trench mask 103 may be removed.

Figure 4D:
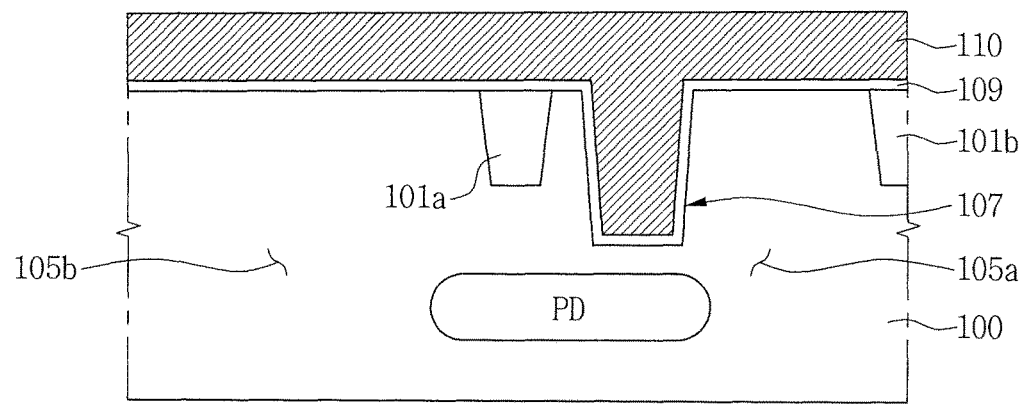

Referring to FIG. 4D, the method may include forming a gate insulating layer 109 and a gate conductive layer 110 on the substrate 100 by performing an oxidation process and/or a deposition process to fill the gate trench 107. The gate insulating layer 109 may be conformally formed on the substrate 100 and sidewalls and bottom of the gate trench 107. The gate insulating layer 109 may include oxidized silicon using a thermal oxidation process. The gate conductive layer 110 may be formed on the entire surface of the gate insulating layer 109 using a deposition process to fill the gate trench 107. The gate conductive layer 110 may include a conductor, such as polysilicon (poly-Si).

Figure 4E:
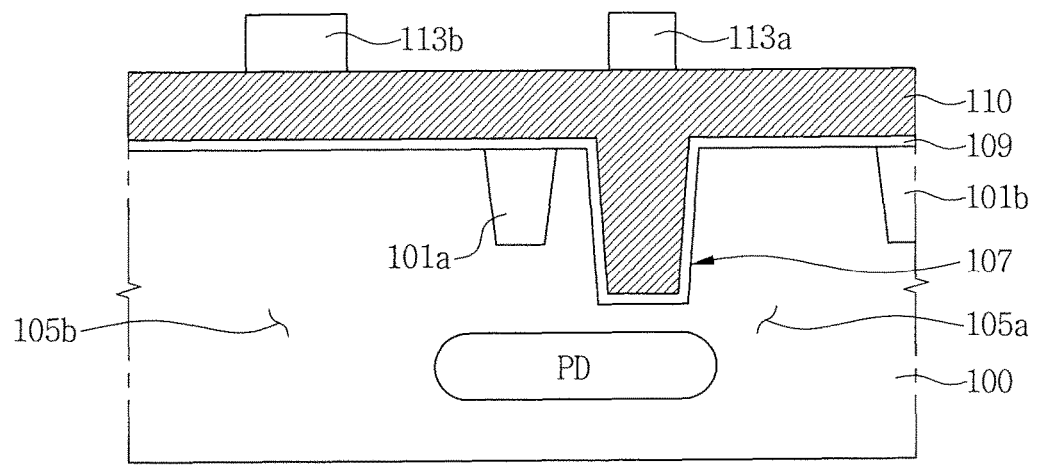

Referring to FIG. 4E, the method may further include forming gate masks 113a and 113b on the gate conductive layer 110. The gate masks 113a and 113b may include a first gate mask 113a and a second gate mask 113b. The first gate mask 113a may overlap the gate trench 107. The gate masks 113a and 113b may include photoresist or hardmask such as silicon nitride or silicon oxide.

Figure 4F:
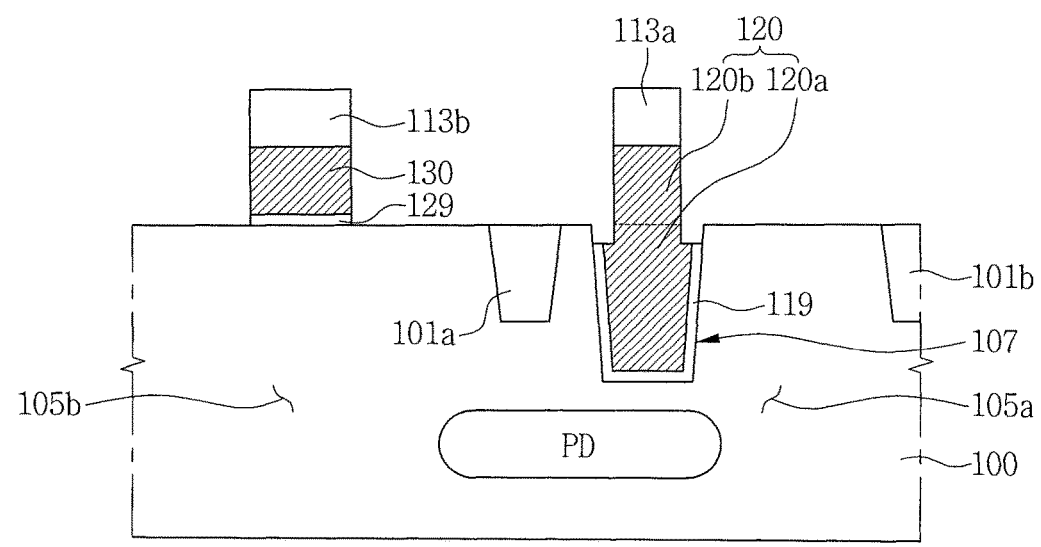

Referring to FIG. 4F, the method may include sequentially etching the gate conductive layer 110 and the gate insulating layer 109 by performing a etching process using the gate masks 113a and 113b as etch masks, to form a transfer gate electrode 120, a transfer gate insulating layer 119, a reset gate electrode 130, and a reset gate insulating layer 129. The first gate mask 113a may define the transfer gate electrode 120 and the transfer gate insulating layer 119, and the second gate mask 113b may define the reset gate electrode 130 and the reset gate insulating layer 129.

The transfer gate electrode 120 may include a buried portion 120a buried within the gate trench 107, and a protruding portion 120b disposed at a higher level than the surface of the substrate 100. Upper corner (edge) portions of the buried portion 120a of the transfer gate electrode 120 may be recessed to a lower level than the surface of the substrate 100. A maximum horizontal width of the protruding portion 120b may be smaller than a maximum horizontal width of the buried portion 120a.

The transfer gate insulating layer 119 may be formed between sidewalls of the gate trench 107 and the buried portion 120a of the transfer gate electrode 120. An upper end portion of the transfer gate insulating layer 119 may be recessed to a level lower than the surface of the substrate 100. In other embodiments, referring to FIGS. 1 and 2, the reset gate electrode 130 and the reset gate insulating layer 129 may be the sensing gate electrode 140 of the sensing transistor Ts and a sensing gate insulating layer or may be the access gate electrode 150 of the access transistor Ta and an access gate insulating layer.

Subsequently, the gate masks 113a and 113b may be removed.

Figure 4G:
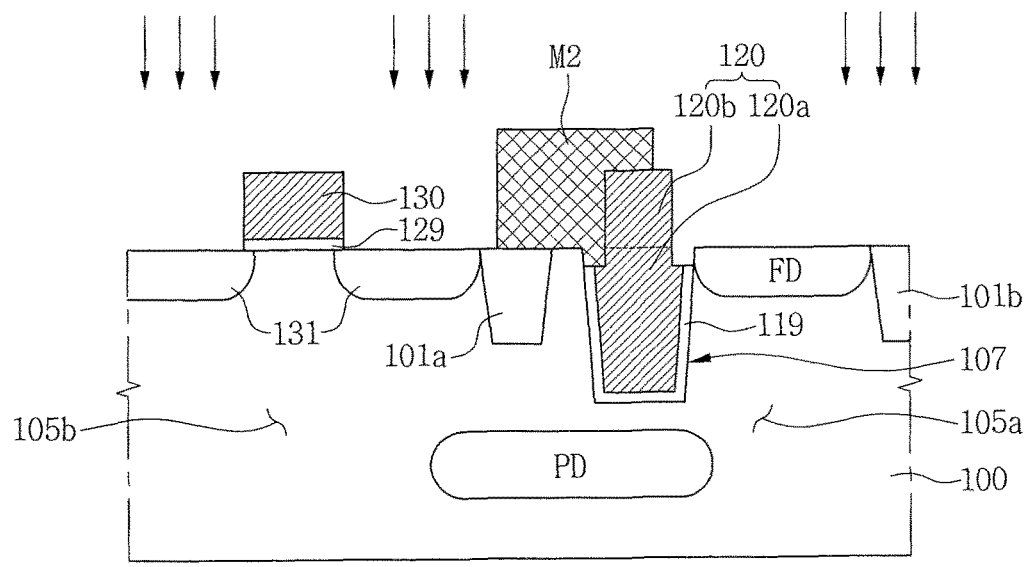

Referring to FIG. 4G, the method may include forming a second ion implantation mask M2 on a substrate 100 and performing an ion implantation process using the second ion implantation mask M2 to form a floating diffusion region FD and source/drain regions 131. The second ion implantation mask M2 may cover a portion of the transfer gate electrode 120 and a portion of the surface of the substrate 100 overlapping the photodiode PD. The second ion implantation mask M2 may include photoresist. After forming the floating diffusion region FD and the source and drain regions 131, the second ion implantation mask 123 may be removed.

Figure 4H:
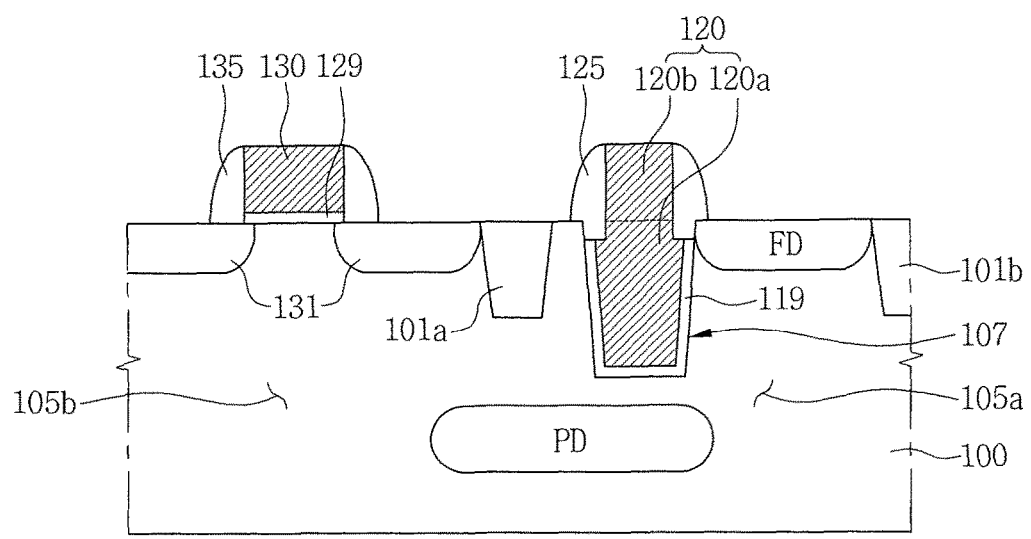

Referring to FIG. 4H, the method may include forming transfer gate spacers 125 and reset gate spacers 135 on sidewalls of the transfer gate electrode 125 and the reset gate electrode 130 using a spacer forming process. The spacer forming process may include depositing a spacer insulating layer on the entire surface of the substrate 100 and performing an etch-back process on the spacer insulating layer to expose a top surface of the substrate 100.

Thereafter, referring to FIG. 3A, the method may include depositing an interlayer insulating layer 160 on the entire surface of the substrate 100 and forming a via plug 165 and a metal interconnection 170 to vertically penetrate the interlayer insulating layer 160 and be electrically connected to the protruding portion 120b of the transfer gate electrode 120.

FIGS. 5A through 5D are cross-sectional views taken along line I-I' of FIG. 2, illustrating methods of fabricating CMOS image sensors according to embodiments of the inventive concept.

Figure 5A:
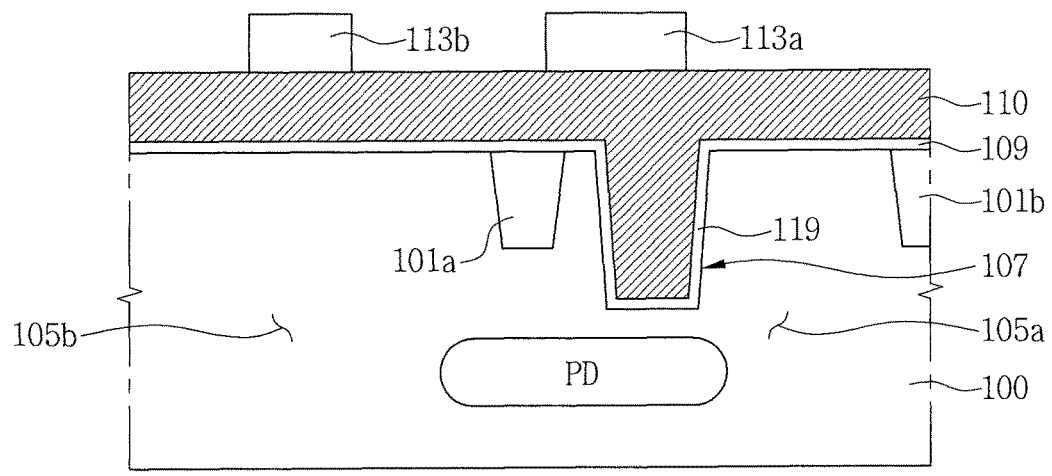

Referring to FIG. 5A, the method may include performing the processes described with reference to FIGS. 4A through 4E to form the gate masks 113a and 113b. The first gate mask 113a may partially overlap the first device isolation layer 101a, which may overlap the photodiode PD.

Figure 5B:
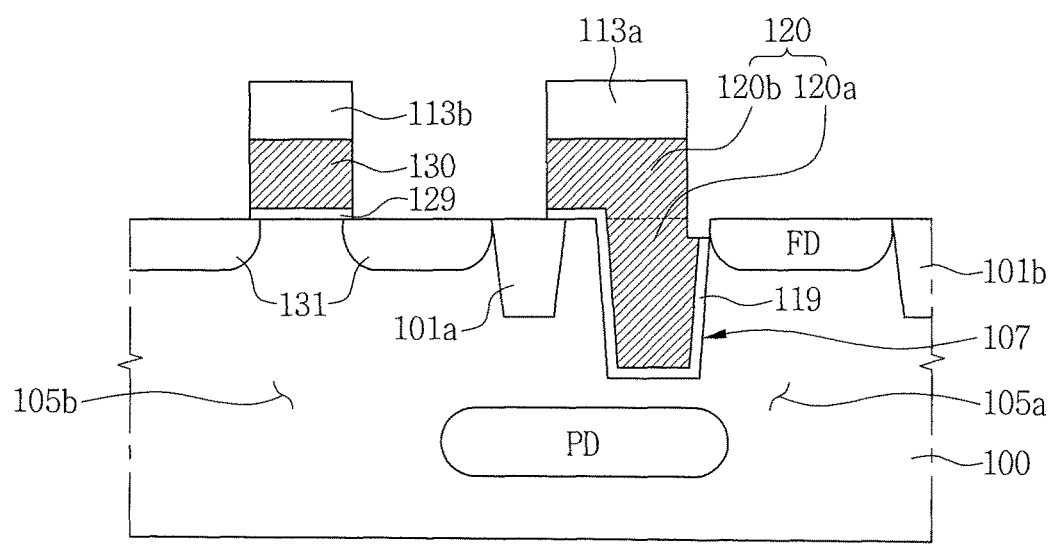

Referring to FIG. 5B and referring back to FIG. 4F, the method may include sequentially etching the gate conductive layer 110 and the gate insulating layer 109 by performing an etching process using the gate masks 113a and 113b as etch masks, to form a transfer gate electrode 120, a transfer gate insulating layer 119, a reset gate electrode 130, and a reset gate insulating layer 129. A portion of the protruding portion 120b of the transfer gate electrode 120 may horizontally extend onto the substrate 100 and the first device isolation layer 101a. In other words, a portion of the protruding portion 120b of the transfer gate electrode 120 may cover the surface of the substrate and a portion of the first device isolation layer 101a, which may overlap the photodiode PD. Subsequently, the gate masks 113a and 113b may be removed.

Figure 5C:
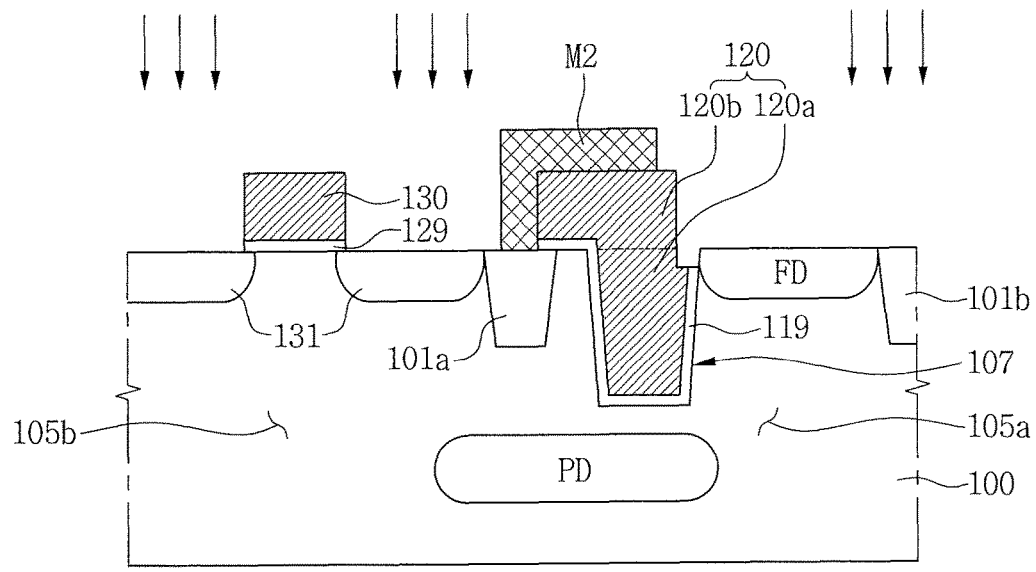

Referring to FIG. 5C and referring back to FIG. 4G, the method may include forming a second ion implantation mask M2 on the substrate 100 and performing an ion implantation process using the second ion implantation mask 123 to form a floating diffusion region FD and source and drain regions 131. Subsequently, the second ion implantation mask M2 may be removed.

Figure 5D:
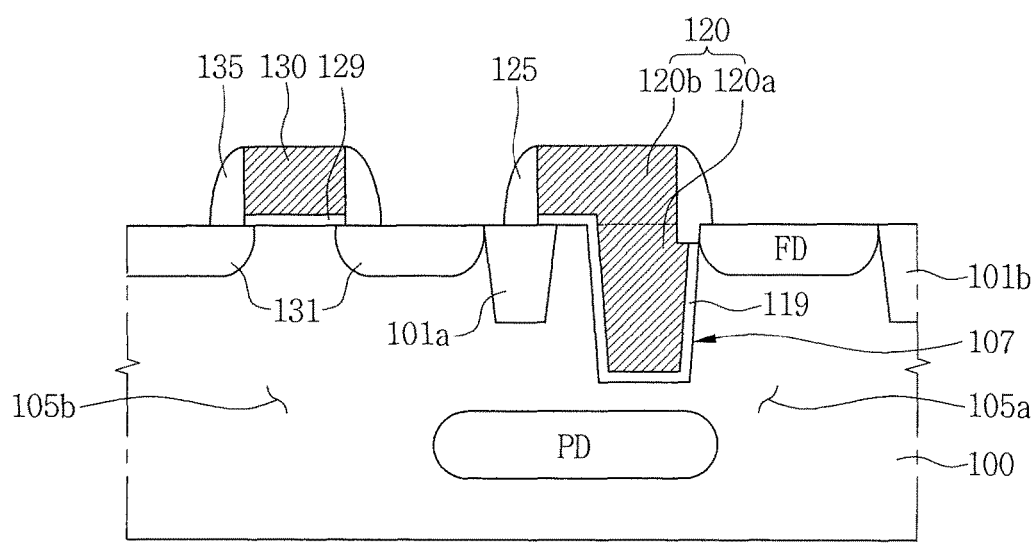

Referring to FIG. 5D and referring back to FIG. 4H, the method may include forming transfer gate spacers 125 and reset gate spacers 135 on sidewalls of the transfer gate electrode 120 and the reset gate electrode 130 using a spacer process.

Thereafter, referring to FIG. 3B, the method may include depositing an interlayer insulating layer 160 on the entire surface of the substrate 100 and forming a via plug 165 and a metal interconnection 170 to vertically penetrate the interlayer insulating layer 160 and be electrically connected to the protruding portion 120b of the transfer gate electrode 120.

FIGS. 6A through 6D are cross-sectional views taken along line I-I' of FIG. 2, illustrating methods of fabricating CMOS image sensors according to embodiments of the inventive concept.

Figure 6A:
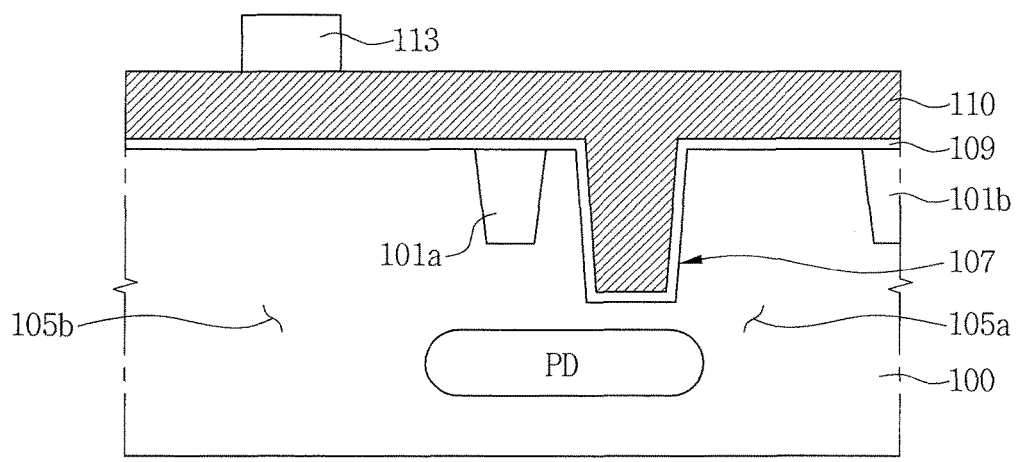

Referring to FIG. 6A, the method may include performing the processes described with reference to FIGS. 4A through 4E to form a gate mask 113. As compared with FIGS. 4E and 5A, the first gate mask 113a may be omitted.

Figure 6B:
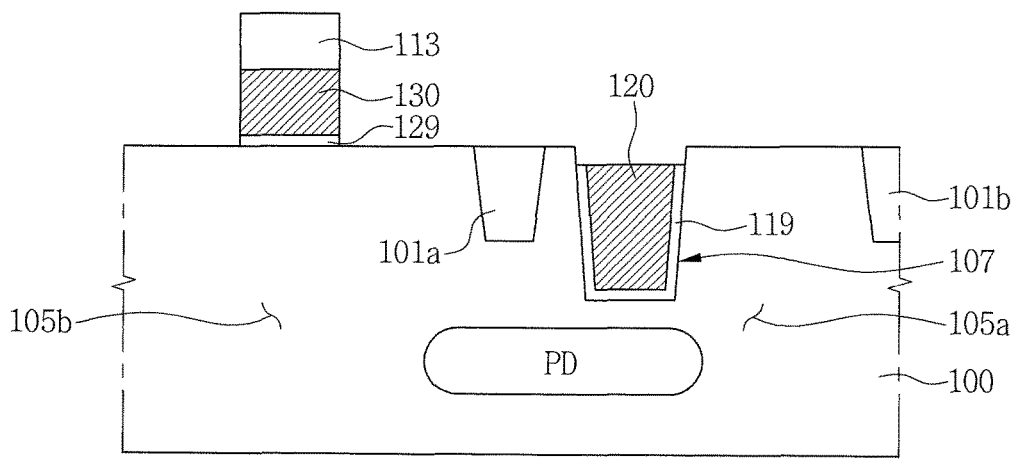

Referring to FIG. 6B and referring back to FIG. 4F, the gate conductive layer 110 and the gate insulating layer 109 may be sequentially etched by performing an etching process using the gate mask 113 as an etch mask, to form a transfer gate electrode 120, a transfer gate insulating layer 119, a reset gate electrode 130, and a reset gate insulating layer 129. The transfer gate electrode 120 may be confined or buried within the gate trench 107. For example, a top surface of the transfer gate electrode 120 and an upper end portion of the transfer gate insulating layer 119 may be recessed to a level lower than the surface of the substrate 100. Subsequently, the gate mask 113 may be removed.

Figure 6C:
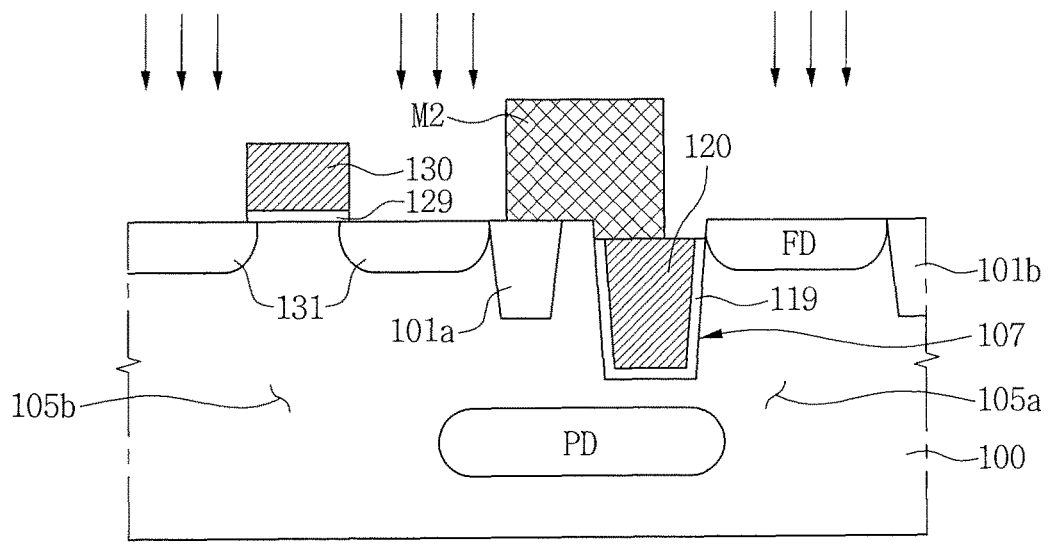

Referring to FIG. 6C and referring back to FIG. 4G, the method may include forming a second ion implantation mask M2 on the substrate 100 and performing an ion implantation process using the second ion implantation mask 123 to form a floating diffusion region FD and source and drain regions 131. Subsequently, the second ion implantation mask M2 may be removed.

Figure 6D:
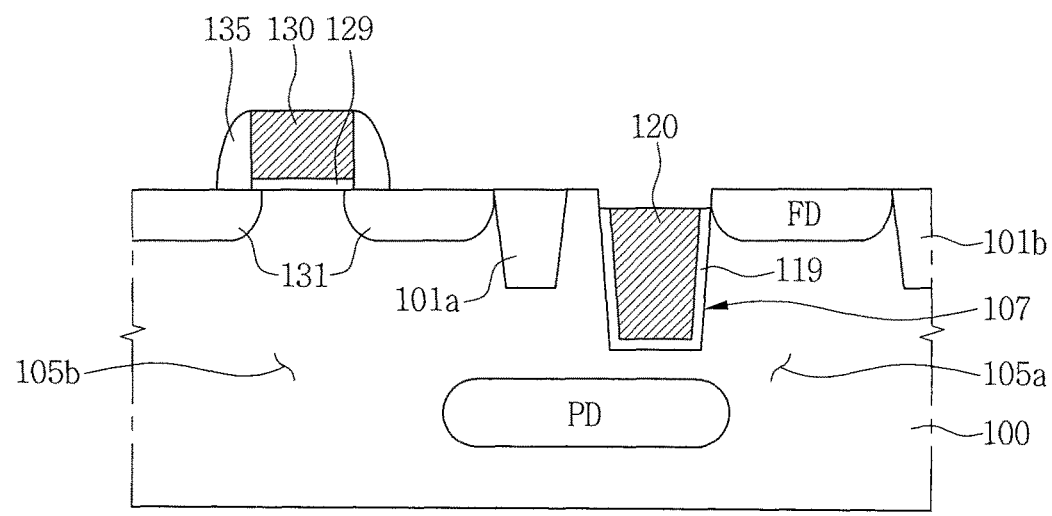

Referring to FIG. 6D and referring back to FIG. 4H, the method may include forming transfer gate spacers 125 and reset gate spacers 135 on sidewalls of the transfer gate electrode 120 and the reset gate electrode 130 using a spacer forming process.

Thereafter, referring to FIG. 3C, the method may include depositing an interlayer insulating layer 160 on the entire surface of the substrate 100 and forming a via plug 165 and a metal interconnection 170 to vertically penetrate the interlayer insulating layer 160 and be electrically connected to the transfer gate electrode 120.

Since the transfer gate electrode 120 does not overlap the floating diffusion region FD, occurrence of a non-uniform electric field may be prevented between the transfer gate electrode 120 and the floating diffusion region FD. Thus, a CMOS image sensor capable of reducing image lag may be completed.

Figure 7:
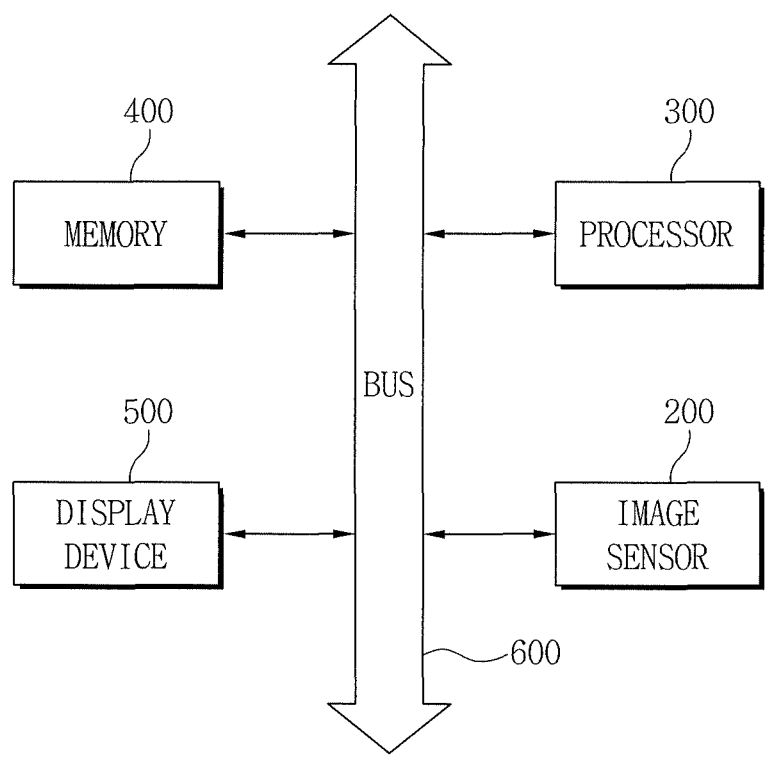
FIG. 7 is a block diagram of an electronic device including an image sensor according to embodiments of the inventive concept.

FIG. 7 is a block diagram of an electronic device including an image sensor according to embodiments of the inventive concept. The electronic device may be, for example, a personal computer (PC), a digital camera, or a mobile device. Referring to FIG. 7, the electronic device may include an image sensor 200, a processor 300, a memory 400, a display device 500, and a bus 600. The image sensor 200 may capture external image information in response to the control of the processor 300. The processor 300 may store the captured image information in the memory 400 through the bus 600. The processor 300 may output the image information stored in the memory 400 to the display device 500. The image sensor 200 may include any one of the CMOS image sensors 10a, 10b, and 10c according to various embodiments of the inventive concept.

Figure 8:
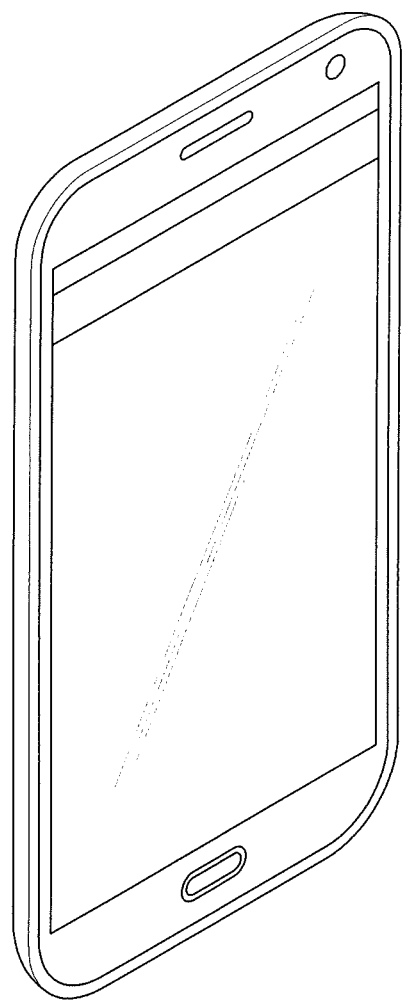
FIGS. 8 through 12 are diagrams of multimedia devices to which an image sensor according to embodiments of the inventive concept can be applied.
Figure 9:
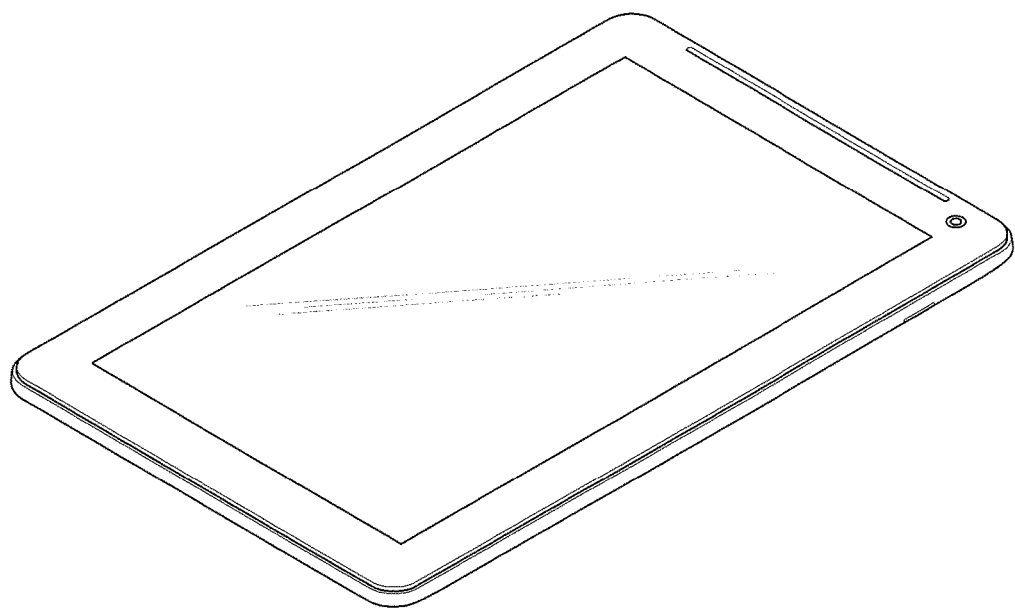
Figure 10:
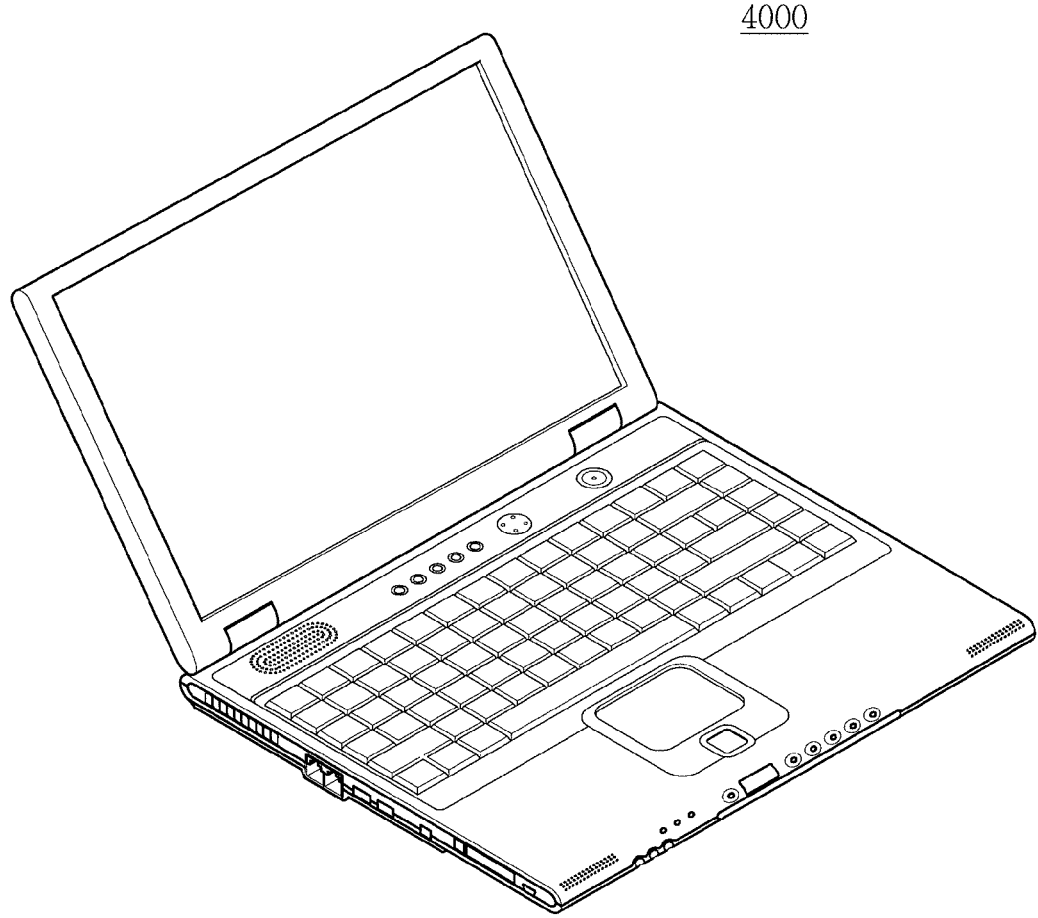
Figure 11:
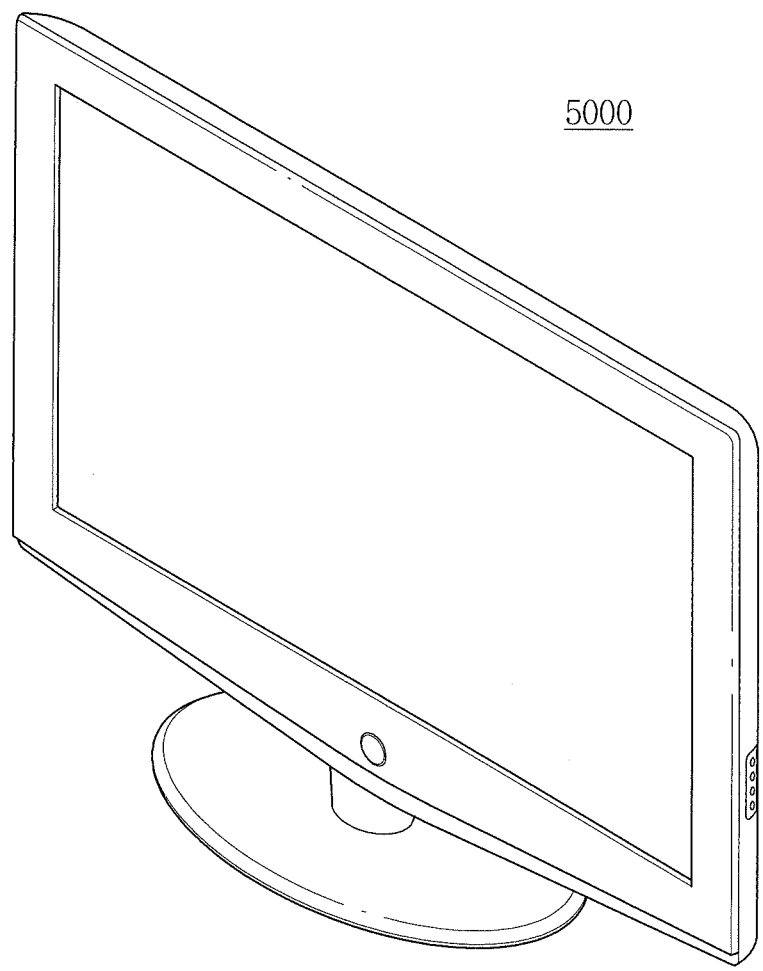
Figure 12:
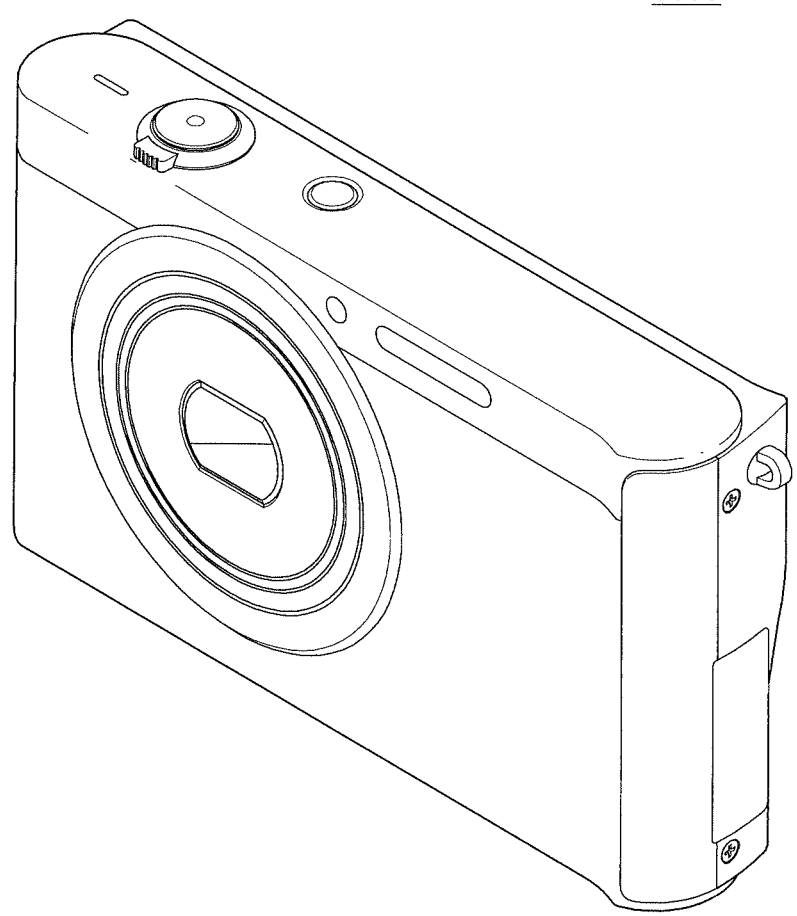

FIGS. 8 through 12 are diagrams of examples of a multimedia device to which an image sensor according to embodiments of the inventive concept may be applied. The image sensors 10a, 10b, and 10c according to the embodiments of the inventive concept may be applied to various multimedia devices having image capturing functions. For instance, the image sensors 10a, 10b, and 10c according to the embodiments of the inventive concept may be applied to a mobile phone or smart phone 2000 as shown in FIG. 8 or applied to a tablet or a smart tablet 3000 as shown in FIG. 9. Also, the image sensors 10a, 10b, and 10c according to the embodiments of the inventive concept may be applied to a laptop computer 4000 as shown in FIG. 10 or applied to a television or smart television 5000 as shown in FIG. 11. Furthermore, the image sensors 10a, 10b, and 10c according to the embodiments of the inventive concept may be applied to a digital camera or a digital camcorder 6000 as shown in FIG. 12.

In a CMOS image sensor according to embodiments of the inventive concept, a vertical transfer gate does not extend onto a floating diffusion region. Thus, occurrence of a non-uniform electric field can be reduced or prevented between a transfer gate and the floating diffusion region so that image lag can be reduced.

The foregoing is illustrative of embodiments and is not to be construed as limiting thereof. Although some embodiments have been described, those skilled in the art will readily appreciate that many modifications are possible without materially departing from the novel teachings and advantages. Accordingly, all such modifications are intended to be included within the scope of this inventive concept as defined in the claims. In the claims, means-plus-function clauses are intended to cover the structures described herein as performing the recited function, and not only structural equivalents but also equivalent structures.

What is claimed is:

1. A complementary metal-oxide-semiconductor (CMOS) image sensor comprising:
   a photodiode in a substrate and spaced apart from a surface of the substrate; and
   a device isolation layer, a transfer gate electrode, and a floating diffusion region in the substrate adjacent to the surface of the substrate to vertically overlap the photodiode,
   wherein the transfer gate electrode is buried in the substrate; and
   wherein a top surface of the transfer gate electrode is at a lower level than the surface of the substrate.

2. The CMOS image sensor of claim 1, further comprising:
   a reset gate electrode having a planar transistor shape; and
   source/drain regions in the substrate adjacent to the reset gate electrode,
   wherein one of the source/drain regions abuts the device isolation layer that partially overlaps the photodiode.

3. The CMOS image sensor of claim 1, further comprising a transfer gate insulating layer between the substrate and the transfer gate electrode,
   wherein an upper end portion of the transfer gate insulating layer is lower than the surface of the substrate.

4. The CMOS image sensor of claim 1, wherein a lowermost end portion of the transfer gate electrode is lower than a lowermost end portion of the device isolation layer.

5. The CMOS image sensor of claim 1:
   wherein a first side surface of the floating diffusion region is adjacent to the transfer gate electrode; and
   wherein a second side surface of the floating diffusion region abuts a second device isolation layer.

* * * * *